United States Patent
Kobayashi et al.

(10) Patent No.: US 10,483,195 B2
(45) Date of Patent: Nov. 19, 2019

(54) RESIN BOARD, METHOD OF MANUFACTURING RESIN BOARD, CIRCUIT BOARD, AND METHOD OF MANUFACTURING CIRCUIT BOARD

(71) Applicant: FUJITSU LIMITED, Kawasaki-shi, Kanagawa (JP)

(72) Inventors: Yasushi Kobayashi, Atsugi (JP); Yoshihiro Nakata, Atsugi (JP); Yoshikatsu Ishizuki, Yokohama (JP); Daijiro Ishibashi, Yokohama (JP); Shinya Sasaki, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/620,091

(22) Filed: Jun. 12, 2017

(65) Prior Publication Data
US 2017/0365545 A1  Dec. 21, 2017

(30) Foreign Application Priority Data
Jun. 21, 2016  (JP) .................. 2016-122946

(51) Int. Cl.
*H01L 23/498* (2006.01)
*H01L 21/48* (2006.01)
*H01L 21/683* (2006.01)

(52) U.S. Cl.
CPC ...... *H01L 23/49827* (2013.01); *H01L 21/486* (2013.01); *H01L 21/4857* (2013.01); *H01L 21/6835* (2013.01); *H01L 23/49811* (2013.01); *H01L 23/49822* (2013.01); *H01L 23/49833* (2013.01); *H01L 23/49838* (2013.01);
(Continued)

(58) Field of Classification Search
CPC .......... H05K 2201/09727; H05K 2201/09818; H05K 2201/09509; H05K 2201/09554; H05K 2201/09563; H05K 1/11–119; H05K 2201/09381; H01L 21/486; H01L 21/4885; H01L 21/76877; H01L 23/49–49894; H01R 13/2478; H01R 13/2485
See application file for complete search history.

(56) References Cited

U.S. PATENT DOCUMENTS 5,049,084 A * 9/1991 Bakke ................ H01R 13/2435
439/591
5,810,607 A * 9/1998 Shih ................... H01R 13/2414
439/66

(Continued)

FOREIGN PATENT DOCUMENTS

JP  2001-102477  4/2001
JP  2004-146602  5/2004
(Continued)

OTHER PUBLICATIONS

Definition of circuit board from https://www.dictionary.com/browse/circuit-board Nov. 14, 2018 (Year: 2018).*

*Primary Examiner* — Roshn K Varghese
(74) *Attorney, Agent, or Firm* — Fujitsu Patent Center

(57) ABSTRACT

A resin board includes: a resin layer and a through electrode buried in the resin layer, wherein the through electrode has an electrode surface exposed from a front surface or a back surface of the resin layer and a lateral surface, and the electrode surface and the lateral surface form an obtuse angle.

11 Claims, 11 Drawing Sheets

(52) U.S. Cl.
CPC .............. *H01L 2221/68345* (2013.01); *H01L 2221/68359* (2013.01); *H01L 2221/68386* (2013.01)

(56) References Cited

U.S. PATENT DOCUMENTS

| | | | | |
|---|---|---|---|---|
| 5,821,626 A * | 10/1998 | Ouchi | ............... | H01L 23/49816 257/778 |
| 6,133,072 A * | 10/2000 | Fjelstad | ............. | H01L 21/4853 257/E23.067 |
| 6,476,503 B1 * | 11/2002 | Imamura | ............... | H01L 21/561 257/737 |
| 7,122,897 B2 * | 10/2006 | Aiba | ................... | H01L 23/3114 257/738 |
| 7,160,119 B2 * | 1/2007 | Rathburn | ............. | G01R 1/0735 439/700 |
| 7,687,916 B2 * | 3/2010 | Lake | ................ | H01L 21/30655 257/773 |
| 8,030,780 B2 * | 10/2011 | Kirby | ................ | H01L 21/76898 257/774 |
| 8,372,741 B1 * | 2/2013 | Co | .......................... | H01L 24/03 438/617 |
| 9,095,074 B2 * | 7/2015 | Haba | .................... | H01L 23/528 |
| 9,502,390 B2 * | 11/2016 | Caskey | ................. | H01L 25/105 |
| 2002/0096361 A1 * | 7/2002 | Saiki | ........................ | B23K 1/20 174/267 |
| 2004/0264837 A1 | 12/2004 | Ogawa | | |
| 2006/0162956 A1 | 7/2006 | Nakamura et al. | | |
| 2008/0203420 A1 * | 8/2008 | Higaki | .................. | H01L 33/486 257/99 |
| 2008/0257596 A1 | 10/2008 | Kaneko | | |
| 2008/0258300 A1 * | 10/2008 | Kobayashi | .......... | H01L 21/4853 257/737 |
| 2010/0295191 A1 | 11/2010 | Kikuchi et al. | | |
| 2011/0304054 A1 * | 12/2011 | Sakai | ................. | H01L 21/3065 257/774 |

FOREIGN PATENT DOCUMENTS

| | | |
|---|---|---|
| JP | 2005-142267 | 6/2005 |
| JP | 2007-081433 | 3/2007 |
| JP | 2008-270346 | 11/2008 |
| WO | 2009/088000 | 7/2009 |

\* cited by examiner

RESIN BOARD, METHOD OF MANUFACTURING RESIN BOARD, CIRCUIT BOARD, AND METHOD OF MANUFACTURING CIRCUIT BOARD

CROSS-REFERENCE TO RELATED APPLICATION

This application is based upon and claims the benefit of priority of the prior Japanese Patent Application No. 2016-122946, filed on Jun. 21, 2016, the entire contents of which are incorporated herein by reference.

FIELD

The embodiments discussed herein are related to a resin board, a method of manufacturing the resin board, a circuit board, and a method of manufacturing the circuit board.

BACKGROUND

Recently, a Fan-out WLP structure or the like, which connects a semiconductor chip having an integrated circuit with a printed circuit board by fine wiring, are being developed for the purpose of miniaturization of the printed circuit board in order to meet requirements of a reduction in size, an improvement of performance, and a reduction in costs of an electronic device.

In order to implement the formation of a fine wiring on a printed circuit board at a low cost, a forming method is under consideration in which only a fine wiring circuit part is formed on a support board and the fine wiring circuit part is transferred onto the printed circuit board. As a method of improving the strength of the fine wiring circuit part, a method of forming a through electrode in a resin board has been developed.

A circuit board is formed by using the resin board including a through electrode therein and providing, on the resin board, a fine wiring layer having wiring connected with an electrode surface of the through electrode exposed from a surface of the resin board. However, in this case, electric field concentration is generated at an end portion of the electrode surface of the through electrode due to an edge effect. Due to the electric field concentration, there is a problem in that material interfaces between the fine wiring layer and the resin board having low voltage resistance coincide each other, and as a result, a short-circuit occurs. The short-circuit considerably degrades the reliability of the circuit board.

The followings are reference documents.
[Document 1] Japanese Laid-Open Patent Publication No. 2004-146602,
[Document 2] Japanese Laid-Open Patent Publication No. 2005-142267,
[Document 3] Japanese Laid-Open Patent Publication No. 2001-102477,
[Document 4] Japanese Laid-Open Patent Publication No. 2007-081433,
[Document 5] Japanese Laid-Open Patent Publication No. 2008-270346, and
[Document 6] International Publication Pamphlet No. WO 2009/088000.

SUMMARY

According to an aspect of the invention, a resin board includes: a resin layer; and a through electrode buried in the resin layer, wherein the through electrode has an electrode surface exposed from a front surface or a back surface of the resin layer and a lateral surface, and the electrode surface and the lateral surface form an obtuse angle.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, a configuration of a resin board, a configuration of a circuit board using the resin board, and a configuration of a semiconductor device having a Fan-out WLP structure using the circuit board will be described with reference to the drawings, together with manufacturing methods thereof.

First Exemplary Embodiment

Figure 1:
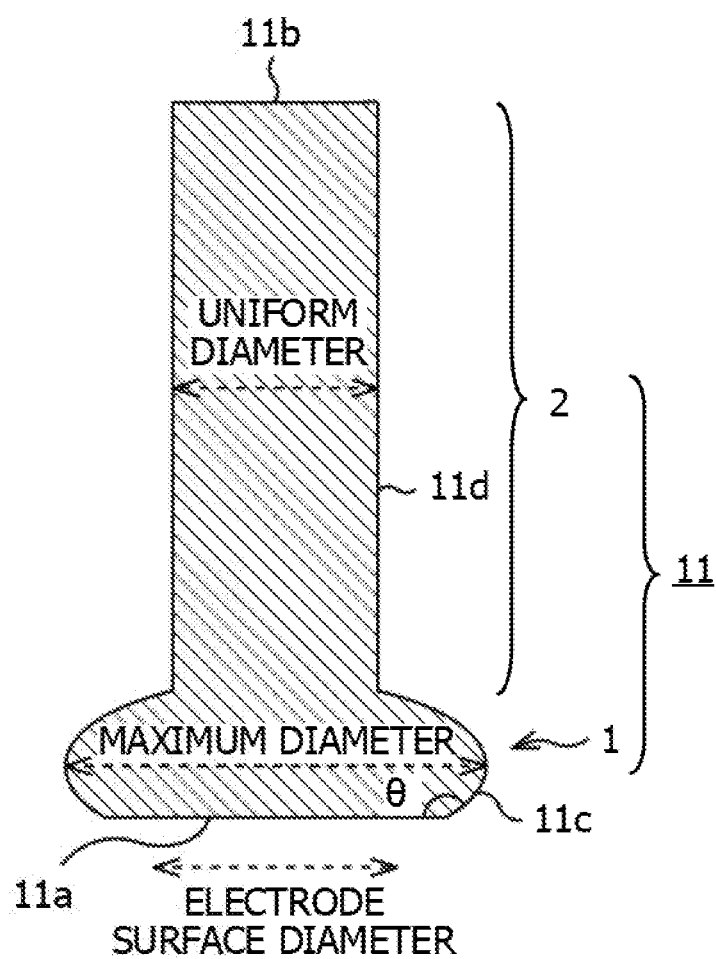
FIG. 1 is a schematic cross-sectional view illustrating a through electrode included in a resin board according to a first exemplary embodiment.
Figure 2A:
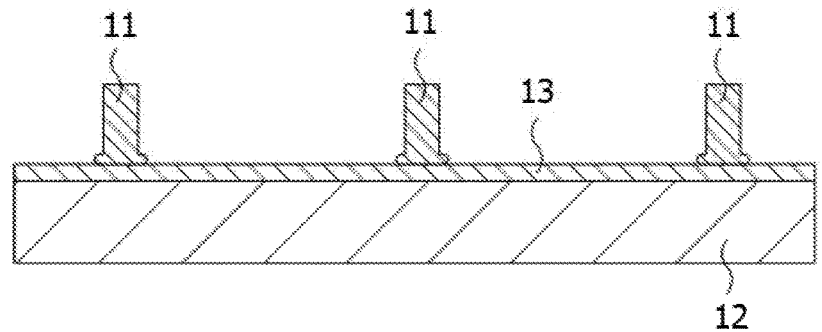
FIGS. 2A to 2C are schematic cross-sectional views illustrating, in the order of processes, a method of manufacturing the resin board according to the first exemplary embodiment.
Figure 2B:
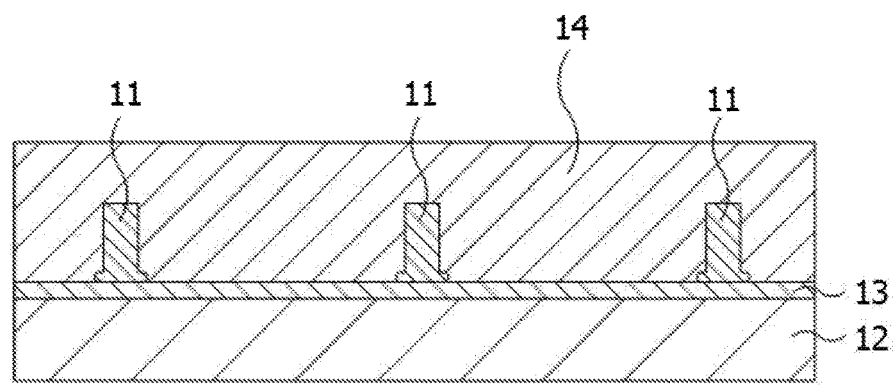
Figure 2C:
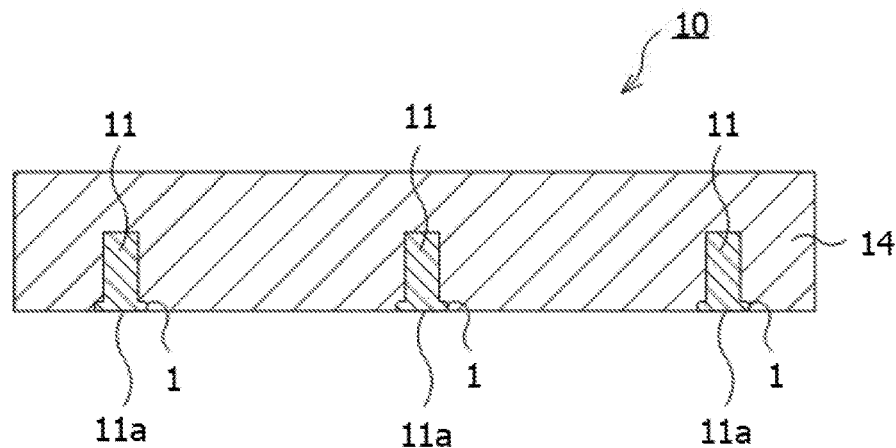
Figure 3A:
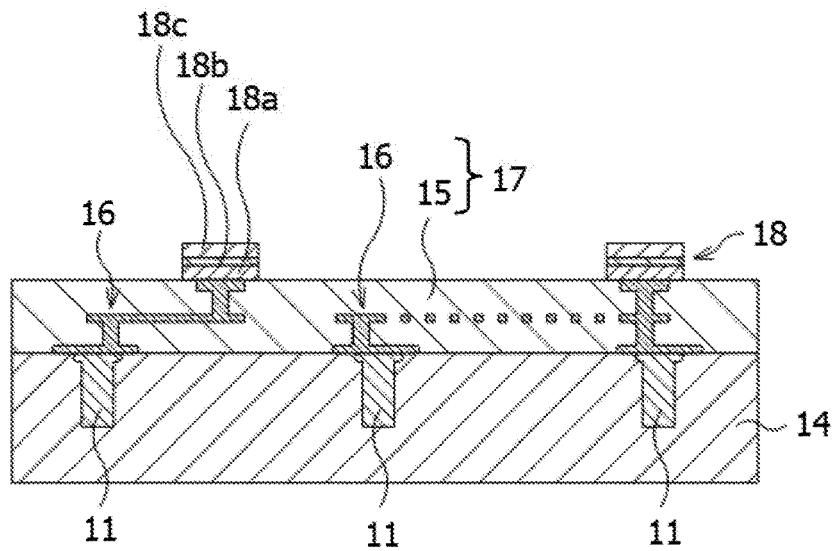
FIGS. 3A to 3C are a schematic cross-sectional view illustrating, in the order of processes continuously from FIGS. 2A to 2C, a method of manufacturing a circuit board by using the resin board according to the first exemplary embodiment.
Figure 3B:
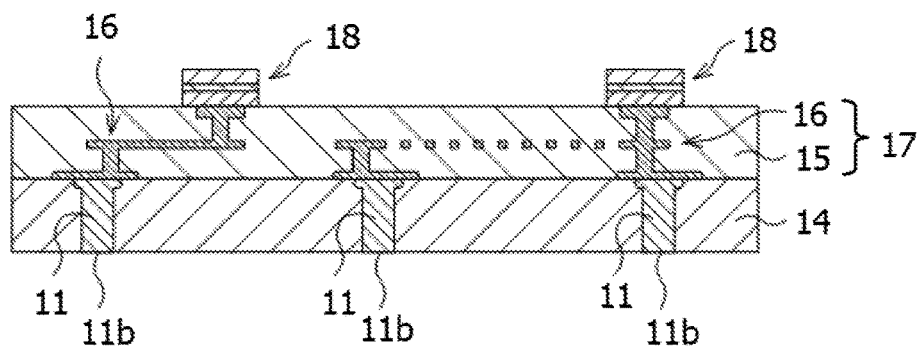
Figure 3C:
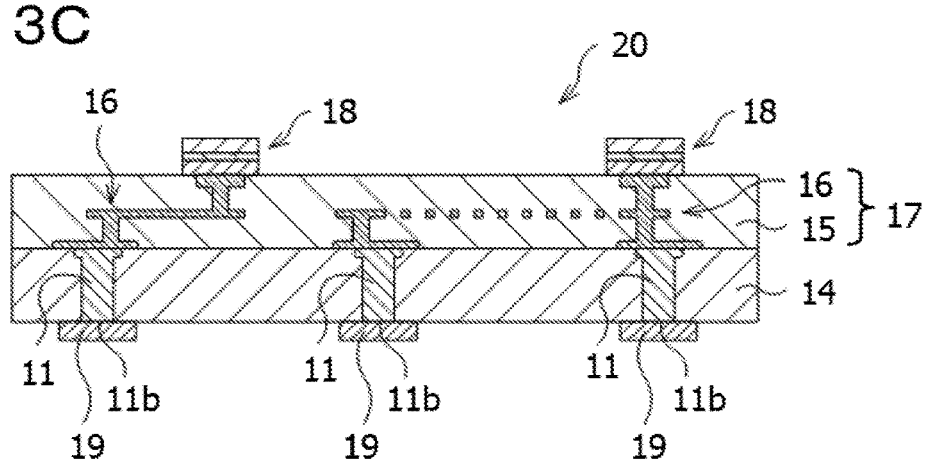
Figure 4A:
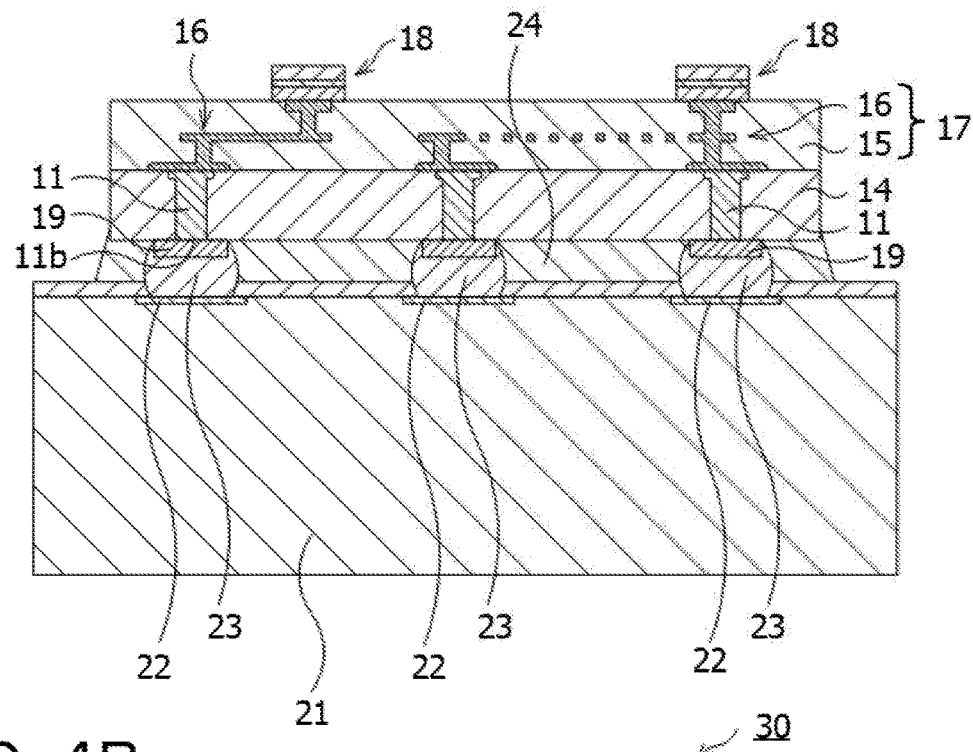
FIGS. 4A and 4B are schematic cross-sectional views illustrating, in the order of processes continuously from FIG. 3, a method of manufacturing a semiconductor device having a Fan-out WLP structure by using the circuit board according to the first exemplary embodiment.
Figure 4B:
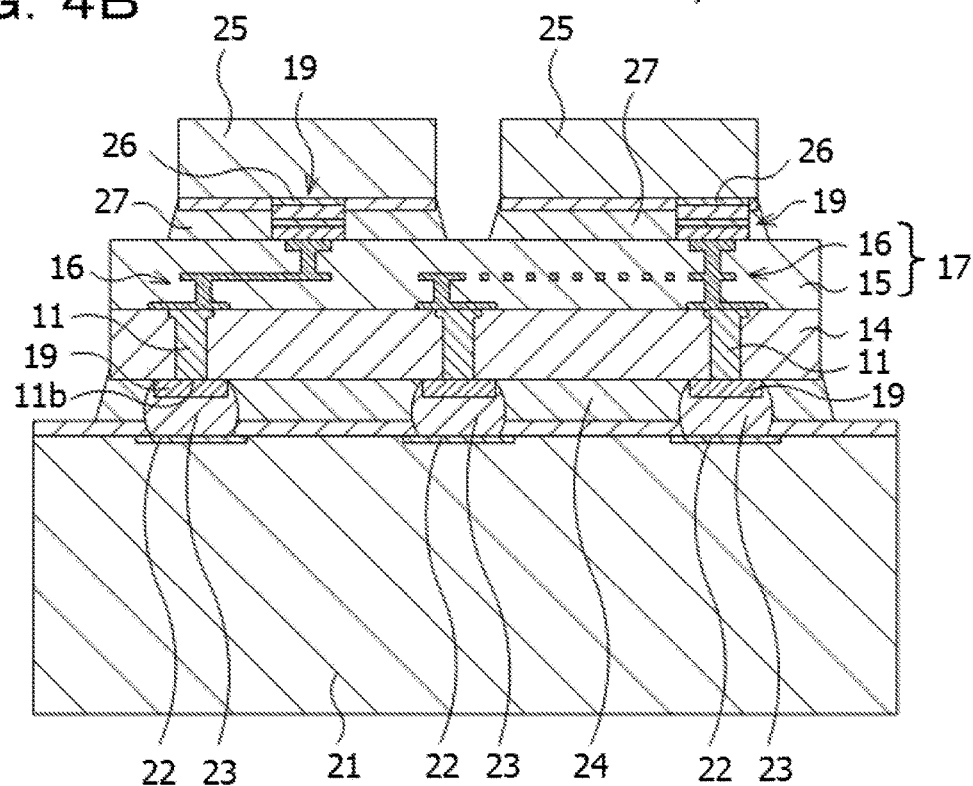

FIG. 1 is a schematic cross-sectional view illustrating a through electrode included in a resin board according to a first exemplary embodiment. FIGS. 2A to 2C are schematic cross-sectional views illustrating, in the order of processes, a method of manufacturing the resin board according to the first exemplary embodiment. FIGS. 3A to 3C are schematic cross-sectional views illustrating, in the order of processes, continuously from FIGS. 2A to 2C, a method of manufacturing a circuit board by using the resin board according to the first exemplary embodiment. FIGS. 4A and 4B are schematic cross-sectional views illustrating, in the order of processes, continuously from FIGS. 3A to 3C, a method of manufacturing a semiconductor device having a Fan-out WLP structure by using the circuit board according to the first exemplary embodiment.

(Method of Manufacturing Resin Board)

First, a method of manufacturing the resin board including a through electrode therein will be described.

A through electrode 11 is formed as illustrated in FIG. 1.

The through electrode 11 is a columnar electrode made of a conductor. A lower portion of the through electrode 11 is a pad portion 1, an upper portion of the through electrode 11 is a column portion 2, and the pad portion 1 and the column portion 2 are integrally formed without a material interface therebetween. The column portion 2 is formed in a uniform diameter region that becomes a minimum diameter portion. The column portion 2 has a lateral surface 11d having a uniform diameter. The pad portion 1 is a region that protrudes laterally and has a maximum diameter portion throughout the entire through electrode 11. The pad portion 1 has a smooth lateral surface 11c of the maximum diameter portion which has no corner portion. Assuming that the bottom surface of the through electrode 11 is a first electrode surface 11a, and the top surface of the through electrode 11 is a second electrode surface 11b, an angle θ between the first electrode surface 11a and the lateral surface 11c of the pad portion 1 is formed as an obtuse angle.

The material of the through electrode 11 may be Cu, Al, W, Au, or the like in view of electrical conductivity and workability, but is not particularly limited as long as the material has electrical conductivity. In the present exemplary embodiment, as a metal pin that becomes the through electrode 11, a cylindrical body made of Cu and having a diameter of about 100 µm and a length of about 250 µm is prepared. The metal pin is fixed to a jig so that an end of the metal pin protrudes by about 40 µm, the protruding portion is plastically deformed by being buckled, and the metal pin is then detached from the jig and cut such that the pin length at the opposite end to the cylindrical body becomes about 200 µm. As a result, the through electrode 11, which is made of Cu and has a pin height of 200 µm, is formed such that the maximum diameter portion is positioned at a position of about 15 µm from the pin end, an arc of the maximum diameter portion has a height of about 30 µm and a maximum diameter of about 110 µm, and the column has a diameter of about 100 µm and a height of about 170 µm.

Through electrodes 11 are distributed on a jig having holes formed at predetermined positions, and the through electrodes 11 are arranged by vibration and suction from the bottom side of the jig. At this time, because the maximum diameter portions of the through electrodes 11 are caught by the holes of the jig, the end surfaces of the through electrodes 11, which are close to the maximum diameter portions, are arranged on the top surface of the jig.

Subsequently, the through electrodes 11 are erected as illustrated in FIG. 2A.

In detail, for example, an adhesion layer 13 made of, for example, a thermoplastic adhesive (Revalpha) is attached to a surface of a support board 12 made of SUS, and the opposite surface of the adhesion layer 13 is brought into contact with the first electrode surfaces 11a which are the end surfaces close to the maximum diameter portions of the through electrodes 11, thereby performing pin erection. The attachment of the through electrodes 11 onto the adhesion layer 13 is performed under a vacuum atmosphere of about 500 Pa to 100 Pa. The attachment may be performed under, for example, a normal pressure atmosphere instead of the vacuum atmosphere.

The adhesion layer 13 has adhesiveness on the both sides thereof such that the adhesion layer 13 may be attached to the surface of the support board 12 and the through electrodes 11 may be attached to the opposite surface of the adhesion layer 13. However, the adhesion layer 13 is not particularly limited as long as at least the grounding surface side of the through electrodes 11 may be separated after the through electrodes 11 are buried by a sealing resin. An adhesive may be appropriately selected. As the adhesive, a thermoplastic adhesive, a UV peeling type adhesive, a solvent soluble adhesive, an acid and alkali soluble adhesive, a physically peelable low adhesiveness adhesive, and the like may be exemplified. However, the adhesive may be the thermoplastic adhesive, the UV peeling type adhesive, or the physically peelable low adhesiveness adhesive, from the viewpoint that peeling is performed within a short time without causing damage to the sealing resin and the through electrodes 11.

Further, because it is required to irradiate the adhesion layer 13 with UV light during the peeling process in a case where the UV peeling type adhesive is used, the sealing resin or the support board 12 made of a UV-transmissive material may be used. Since the irradiation with UV light from the sealing resin is shaded with respect to the attachment surfaces of grounding portions of the through electrodes 11, the support board 12 may be made of a UV-transmissive material. In addition, the physically peelable low adhesiveness adhesive may not be used for a typical through electrode having a flat surface because a close contact property thereof is low with respect to the typical through electrode having a flat surface because of the adhesiveness thereof, and pin extraction is caused when the sealing resin is introduced. In the present exemplary embodiment, the through electrodes 11 may be used without causing the so-called pin extraction, by a sucker effect of the through electrodes 11 which will be described below.

Subsequently, as illustrated in FIG. 2B, a resin layer 14 is formed in which the through electrodes 11 are buried.

In detail, the jig is detached from the through electrode 11, for example, liquid sealing resin is applied, and the sealing resin is pressed by a mold. Therefore, on the adhesion layer 13, the resin layer 14 is formed in which the through electrodes 11 are buried.

The resin layer 14 is made of a sealing resin in which the through electrodes 11 erected on the adhesion layer 13 are buried, and may be cured to form a board. The resin layer 14 has fluidity before it is cured. The sealing resin is not particularly limited as long as the sealing resin may be cured by being heated or pressed. The sealing resin may be appropriately selected from a liquid resin, a granular resin, a tablet resin, and the like. In addition, the sealing resin may contain filler in order to inhibit the sealing resin from being warped due to thermal contraction or CTE reduction caused by a thermal process after the board is formed. As the filler, alumina, silica, aluminum hydroxide, aluminum nitride, and the like may be exemplified.

Subsequently, as illustrated in FIG. 2C, the resin layer 14 is peeled from the adhesion layer 13.

In detail, the support board 12 formed with the resin layer 14 thereon is heated at a temperature of about 80° C. to 170° C., and the resin layer 14 is peeled from the adhesion layer 13. The resin layer 14 is fired for about one hour in an oven at about 180° C. to 250° C. so as to completely cure the resin layer 14. In this way, a resin board 10 having a thickness of about 600 μm and having through electrodes 11 included in the resin layer 14 is formed. The first electrode surfaces 11*a* of the through electrodes 11 are exposed from the surface (bottom surface in FIG. 2C) of the resin board 10. In the molding of the resin board 10 as described above, pin extraction does not occur due to the flow resistance of the liquid sealing resin.

(Method of Manufacturing Circuit Board)

Next, a method of manufacturing a circuit board having the resin board 10 will be described.

Subsequently from FIG. 2C, a multilayered wiring structure 17 and first bumps 18 are formed as illustrated in FIG. 3A.

In detail, first, Ti having a thickness of about 0.1 μm as a close contact layer for forming fine wiring and Cu having a thickness of about 0.5 μm as a seed layer are sequentially formed, by a sputtering method, on the surface of the resin layer 14 where which the first electrode surfaces 11*a* of the through electrodes 11 are exposed.

Next, for example, a novolac-type liquid resist is applied by a spin coating method. The resist is exposed and developed by a contact aligner using a glass mask having land patterns of about φ100 μm. Therefore, a resist mask having openings of the land patterns of about φ100 μm is formed on the first electrode surfaces 11*a* of the through electrodes 11 in the resin layer 14.

Next, plating is performed in the openings of the land patterns of the resist mask by electrolytic Cu plating. In this case, the electrolytic Cu plating is performed to a height of about 5 μm. The resist mask is peeled using, for example, N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. Therefore, lands of about φ100 μm are formed on the first electrode surfaces 11*a*.

Next, for example, a photosensitive polyimide resin material is applied by spin coating, and temporarily cured for about two minutes by a hot plate at about 150° C. Thereafter, the photosensitive polyimide resin material is exposed and developed by a contact aligner using a glass mask having via patterns of φ70 μm which are disposed to be superimposed on the lands of about φ100 μm. Therefore, via grooves of about φ70 μm, which communicate with the lands, are formed in the photosensitive polyimide resin material. Thereafter, the photosensitive polyimide resin material is mainly cured for about one hour at about 180° C. to 250° C. using an oven under a nitrogen atmosphere. Therefore, a first insulating layer having a thickness of about 10 μm is formed.

Next, Ti having a thickness of about 0.1 μm as a close contact layer and Cu having a thickness of about 0.5 μm as a seed layer are sequentially formed by a sputtering method.

Next, for example, a novolac-type liquid resist is applied by a spin coating method. The resist is exposed and developed by a contact aligner using a glass mask having land patterns of about φ100 μm, which are disposed to be superimposed on the via grooves of about φ70 μm, and having a wiring pattern having a width of about 5 μm. Therefore, a resist mask, which has openings of the land patterns of about φ100 μm and the wiring pattern of about 5 μm at predetermined positions, is formed.

Next, plating is performed in the openings of the land patterns and the wiring pattern of the resist mask by electrolytic Cu plating. In this case, the electrolytic Cu plating is performed to a height of about 5 μm. The resist mask is peeled using N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. As a result, the lands and the wiring are formed.

Next, for example, a photosensitive polyimide resin material is applied by spin coating, and temporarily cured for about two minutes by a hot plate at about 150° C. Thereafter, the photosensitive polyimide resin material is exposed and developed by a contact aligner using a glass mask having via patterns of about φ70 μm which are disposed to be superimposed on the lands of about φ100 μm. Therefore, via grooves of about φ70 μm, which communicate with the lands, are formed in the photosensitive polyimide resin material. Thereafter, the photosensitive polyimide resin material is mainly cured for about one hour at about 180° C. to 250° C. using an oven under a nitrogen atmosphere. Therefore, a second insulating layer having a thickness of about 10 μm is formed.

Next, Ti having a thickness of about 0.1 μm as a close contact layer and Cu having a thickness of about 0.5 μm as a seed layer are sequentially formed by a sputtering method.

Next, for example, a novolac-type liquid resist is applied by a spin coating method. The resist is exposed and developed by a contact aligner using a glass mask having land patterns of about φ100 μm, which are disposed to be superimposed on the via grooves of about φ70 μm, and a wiring pattern having a width of about 5 μm. Therefore, a resist mask, which has openings of the land patterns of about φ100 μm and the wiring pattern of about 5 μm at predetermined positions, is formed.

Next, plating is performed in the openings of the land patterns and the wiring pattern of the resist mask by electrolytic Cu plating. In this case, the electrolytic Cu plating is performed to a height of about 5 μm. The resist mask is peeled using N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. As a result, the lands and the wiring are formed.

Next, for example, a photosensitive polyimide resin material is applied by spin coating, and temporarily cured for about two minutes by a hot plate at about 150° C. Thereafter, the photosensitive polyimide resin material is exposed and developed by a contact aligner using a glass mask having via patterns of about φ70 μm which are disposed to be superimposed on the lands of about φ100 μm. Therefore, via grooves of about φ70 μm, which communicate with the lands, are formed in the photosensitive polyimide resin material. Thereafter, the photosensitive polyimide resin material is mainly cured for about one hour at about 180° C.

to 250° C. using an oven under a nitrogen atmosphere. Therefore, a third insulating layer having a thickness of about 10 µm is formed.

Therefore, a multilayered wiring structure 17, in which a wiring layer 16 having the lands and the wiring is buried in an insulating layer 15 that includes a first insulating layer, a second insulating layer, a the third insulating layer, is formed.

The above-mentioned process of manufacturing the multilayered wiring structure 17 is one aspect of the present exemplary embodiment, and any other forming methods may be appropriately selected as necessary. In addition, in a case where three or more wiring layers are laminated, the wiring layers may be formed by repeating the above-mentioned process.

Next, Ti having a thickness of about 0.1 µm as a close contact layer and Cu having a thickness of about 0.5 µm as a seed layer are sequentially formed by a sputtering method.

Next, for example, a novolac-type liquid resist is applied by a spin coating method. The resist is exposed and developed by a contact aligner using a glass mask having first bump patterns of about φ100 µm which are disposed to be superimposed on via grooves of about φ70 µm formed in the uppermost layer of a fine wiring portion. Therefore, a resist mask, which has openings of the first bump patterns of about φ100 µm at predetermined positions, is formed.

Next, plating is performed in the openings of the first bump patterns of the resist mask by electrolytic Cu plating, electrolytic Ni plating, and electrolytic SnAg plating. In this case, the electrolytic Cu plating is performed to a height of about 30 µm, the electrolytic Ni plating is performed to a height about 10 µm, and the electrolytic SnAg plating is performed to a height about 30 µm. The resist mask is peeled using N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. Therefore, a Cu layer 18a, a Ni layer 18b, and a SnAg layer 18c are sequentially laminated and first bumps 18 electrically connected to the wiring layer 16 are formed.

Subsequently, as illustrated in FIG. 3B, the second electrode surface 11b of the through electrode 11 is exposed from a back surface of the resin layer 14.

In detail, for example, a BG tape is attached to a surface of the multilayered wiring structure 17, and the back surface of the resin layer 14 of the resin board 10 is ground by, for example, back grinding, such that the second electrode surfaces 11b are exposed.

Subsequently, as illustrated in FIG. 3C, second bumps 19 are formed.

In detail, Ti having a thickness of about 0.1 µm as a close contact layer and Cu having a thickness of about 0.5 µm as a seed layer are sequentially formed by a sputtering method on the back surface of the resin layer 14 where the second electrode surfaces 11b are exposed.

Next, for example, a novolac-type liquid resist is applied by a spin coating method. The resist is exposed and developed by a contact aligner using a glass mask having second bump patterns of about φ500 µm which are disposed to be superimposed on the through electrodes 11. Therefore, a resist mask, which has openings of the second bump patterns of about φ500 µm at a predetermined position, is formed.

Next, plating is performed in the openings of the second bump patterns by electrolytic Cu plating. In this case, the electrolytic Cu plating is performed to a height about 100 µm from the second electrode surfaces 11b. The resist mask is peeled using N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. Therefore, the second bumps 19 electrically connected to the through electrodes 11 are formed.

Therefore, a circuit board 20 having the resin board 10 is formed.

(Method of Manufacturing Semiconductor Device)

Next, a method of manufacturing a semiconductor device having the circuit board 20 will be described.

Subsequently from FIG. 3C, as illustrated in FIG. 4A, the circuit board 20 is mounted on a printed circuit board 21.

In detail, first, solder balls 23 having a diameter of about 700 µm are disposed on bumps 22 on the printed circuit board 21. A flux is applied such that the second bumps 19 are mounted to come into contact with the solder balls 23, respectively. Thereafter, reflow is performed at a temperature of about 260° C., and flux cleaning is performed.

Next, a gap between the front surface of the printed circuit board 21 and the back surface of the circuit board 20 is buried by an under fill 24. The under fill is injected by heating of about 110° C., and a curing process is performed for about one hour at about 120° C. to 170° C. after the injection. After curing the under fill 24, no defect such as deformation is found in the multilayered wiring structure 17.

Here, the forming process illustrated in FIG. 4A is one aspect of joining the circuit board 20 to the printed circuit board 21, and any other forming process may be appropriately selected as necessary. In addition, the circuit board 20 may be mounted on a semiconductor chip using a predetermined semiconductor chip instead of the printed circuit board 21.

Subsequently, as illustrated in FIG. 4B, semiconductor chips 25 are mounted on the circuit board 20.

In detail, first, the semiconductor chips 25 are disposed on the circuit board 20 such that the first bumps 18 and bumps 26 of the semiconductor chips 25 come into contact with each other. Thereafter, reflow is performed at a temperature of about 260° C., and flux cleaning is performed.

Next, a gap between the front surface of the circuit board 20 and the back surfaces of the semiconductor chips 25 are buried by an under fill 27. The under fill is injected by heating of about 110° C., and a curing process is performed for about one hour at about 120° C. to 170° C. after the injection.

Therefore, a semiconductor device 30 in which the semiconductor chips 25 are mounted on the circuit board 20 is formed. As a result of evaluating the reliability of the formed semiconductor device 30, it has been found that neither electrical connection defect nor electric leakage is observed and the semiconductor device is good.

The forming process illustrated in FIG. 4B is one aspect of joining the semiconductor chips 25 to the circuit board 20, and any other forming process may be appropriately selected as necessary. In addition, the printed circuit board may be mounted on the circuit board 20 by using the predetermined printed circuit board instead of the semiconductor chip 25.

In general, the through electrodes are often formed to have a columnar structure having a uniform diameter. In this case, electric fields between the through electrodes are concentrated at the end edge portions of the through electrodes by an edge effect. That is, in a case where the multilayered wiring structure is formed on the resin layer of the resin board, electric fields are concentrated between the through electrodes at material interfaces between the resin layer of the resin board and the insulating layer of the multilayered wiring structure, and as a result, a short-circuit occurs at the material interface having low voltage resistance. In addition, in the case of a through electrode having a tapered shape in which the through electrode diameter is increased toward any one of front and back surfaces of the resin board, electric fields are significantly concentrated at a side having a larger electrode diameter, and as a result, reliability of the circuit board significantly deteriorates.

Figure 5:
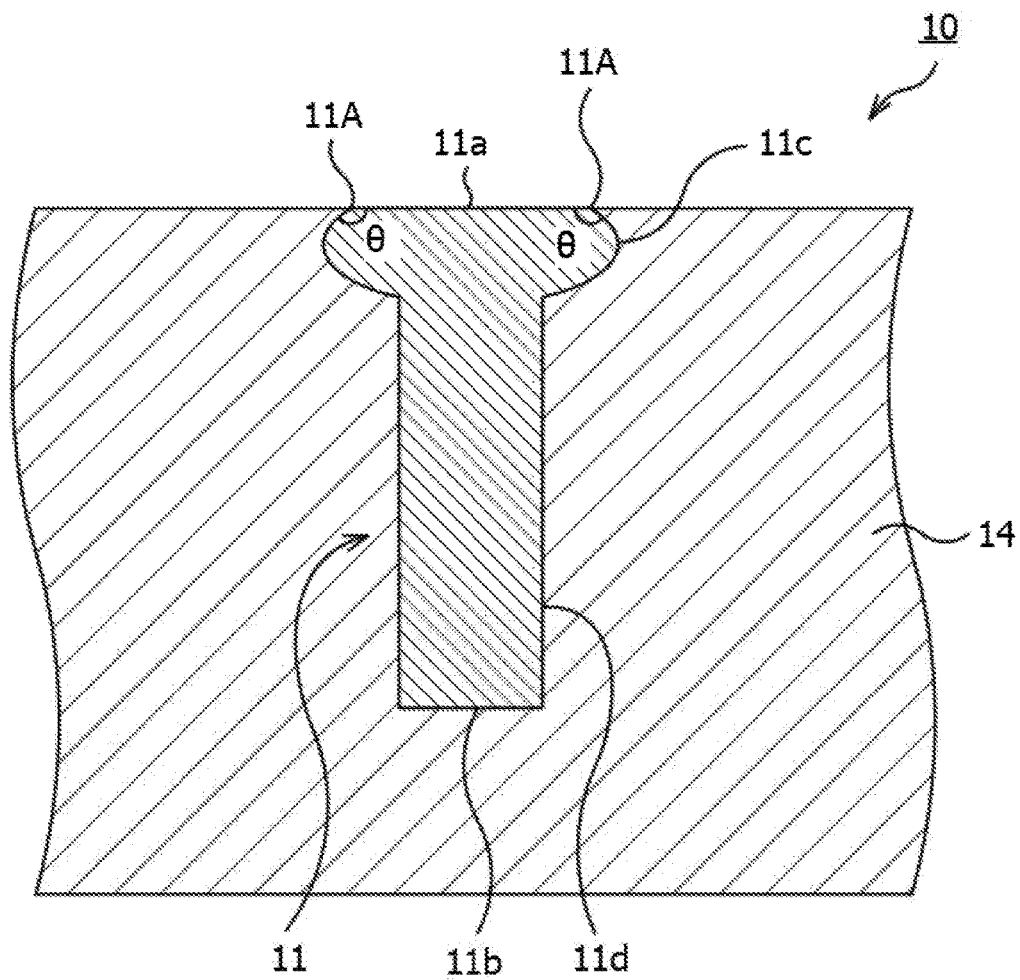
FIG. 5 is a schematic cross-sectional view for explaining an operational effect of the through electrode of the resin board according to the first exemplary embodiment.

As illustrated in FIG. 5, in the resin board 10 according to the present exemplary embodiment, an angle θ between the first electrode surface 11a exposed from the surface of the resin layer 14 and the lateral surface 11c of the pad portion 1 in the through electrode 11 is formed as an obtuse angle. With the configuration, the electric field concentration at an edge portion 11A is mitigated, and an insulation breakdown is inhibited such that a short-circuit is suppressed.

In the through electrode 11, the pad portion 1, which has the smooth lateral surface 11c with no corner portion at the maximum diameter portion, is formed, and the maximum diameter portion is positioned at a more inner side than the front and back surfaces of the resin layer 14. With the configuration, an electric field applied between the through electrodes 11 is shifted to the inside of the resin board 10 such that electric field concentration at the edge portion 11A is further mitigated.

In the through electrode 11, the pad portion 1 is eccentrically located at any one of the front surface side and the back surface side of the resin layer 14 (in FIG. 5, the front surface side). With the configuration, the shift effect of electric field concentration varies depending on a distance from the electrode surface of the through electrode 11 to the maximum diameter portion, and as a result, the side where the maximum diameter portion is closer to the electrode surface (here, the first electrode surface 11a) may effectively trap the electric field concentration.

In the through electrode 11, a portion other than the pad portion 1 is formed as the column portion 2 having a uniform diameter region which is the minimum diameter portion. With the configuration, it is possible to inhibit unnecessary electric field concentration at a point other than the maximum diameter portion.

As described above, according to the present exemplary embodiment, the electric field concentration at the through electrode 11 is mitigated so that a highly reliable resin board 10 inhibiting the occurrence of a short-circuit is implemented.

By using the resin board 10, the electric field concentration at the through electrode 11 is mitigated, and as a result, the occurrence of a short-circuit at an interface between the resin board and the multilayered wiring structure 17 is inhibited so that a highly reliable circuit board 20 which may be obtained at a high yield and with low costs is implemented.

Further, by using the circuit board 20, a sufficient mechanical strength of the multilayered wiring structure 17 may be obtained, and as a result, a semiconductor device 30 having excellent resistance against stress caused by CTE mismatch among the printed circuit board 21, the under fills 24 and 27, and the semiconductor chip 25.

Second Exemplary Embodiment

Figure 6:
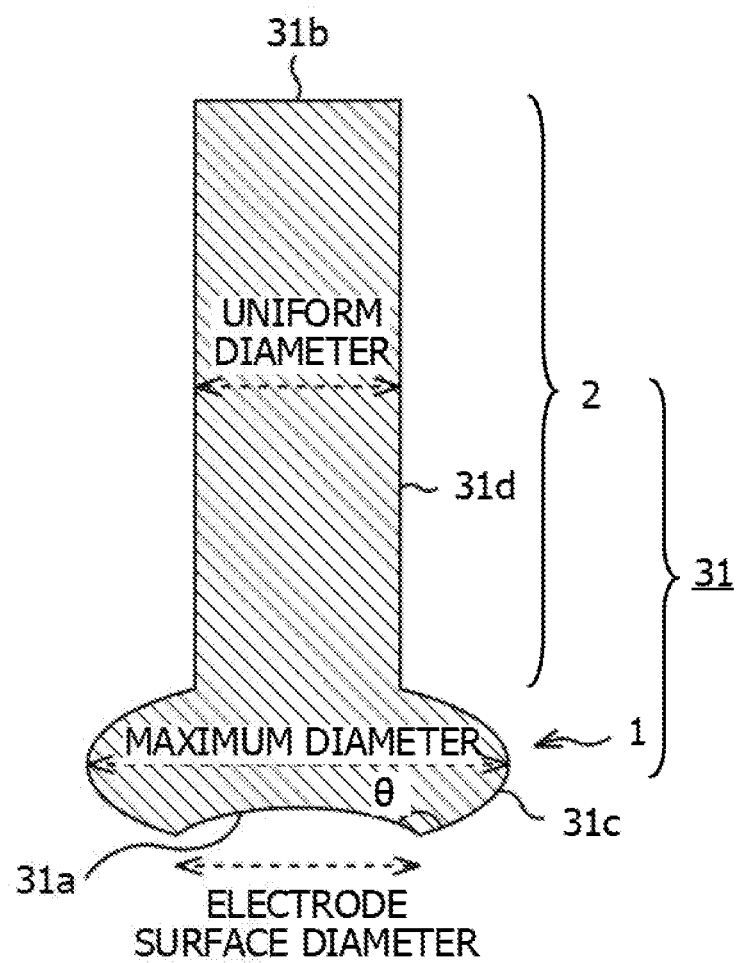
FIG. 6 is a schematic cross-sectional view illustrating a through electrode included in a resin board according to a second exemplary embodiment.
Figure 7A:
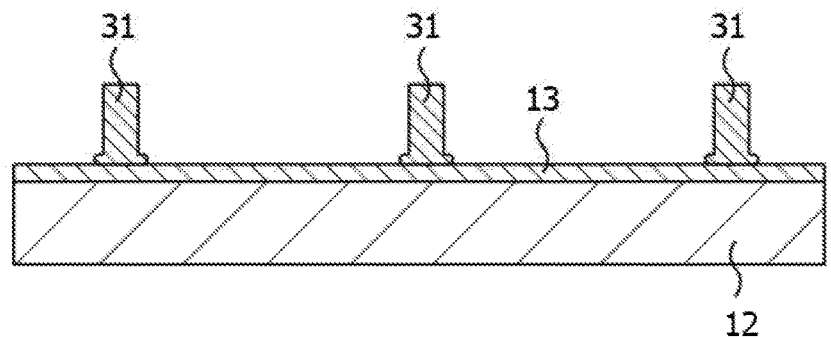
FIGS. 7A to 7C are schematic cross-sectional views illustrating, in the order of processes, a method of manufacturing the resin board according to the second exemplary embodiment.
Figure 7B:
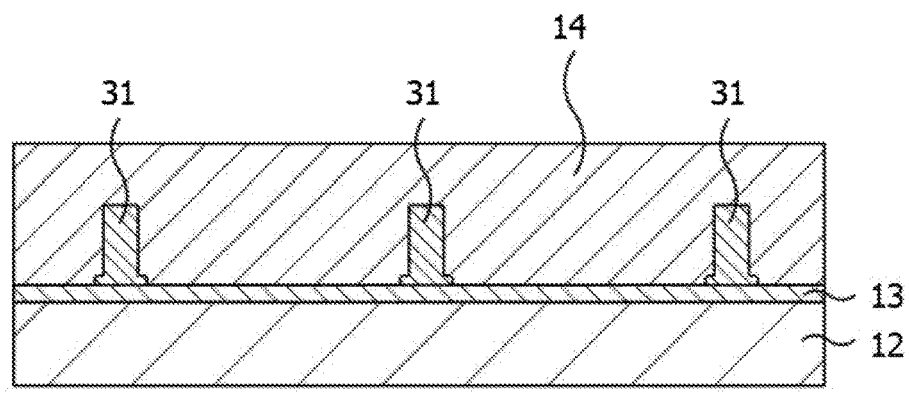
Figure 7C:
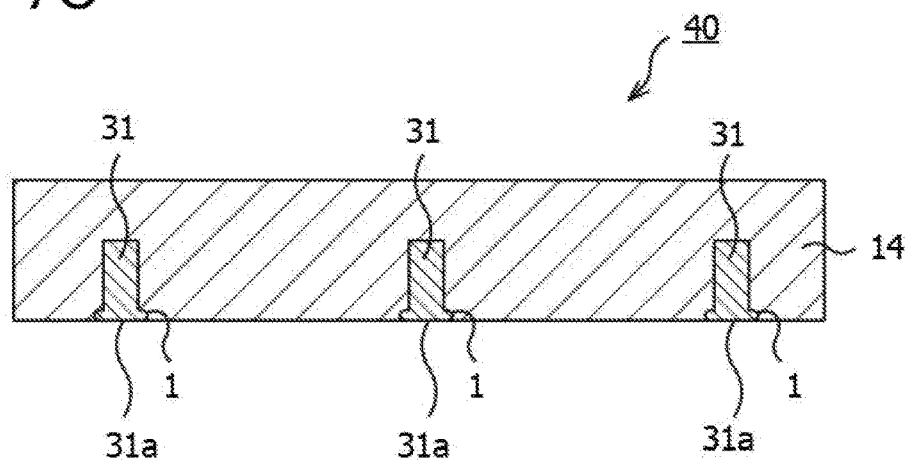
Figure 8A:
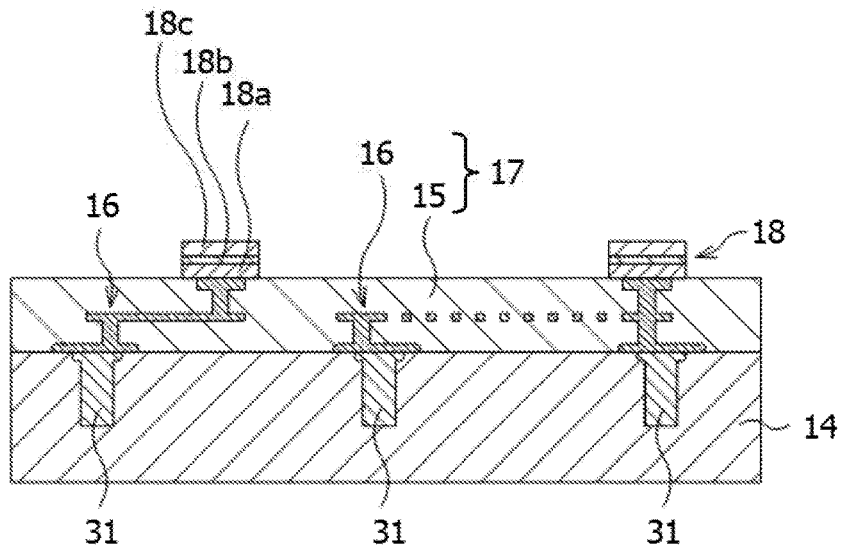
FIGS. 8A to 8C are schematic cross-sectional view illustrating, in the order of processes continuously from FIGS. 7A to 7C, a method of manufacturing a circuit board by using the resin board according to the second exemplary embodiment.
Figure 8B:
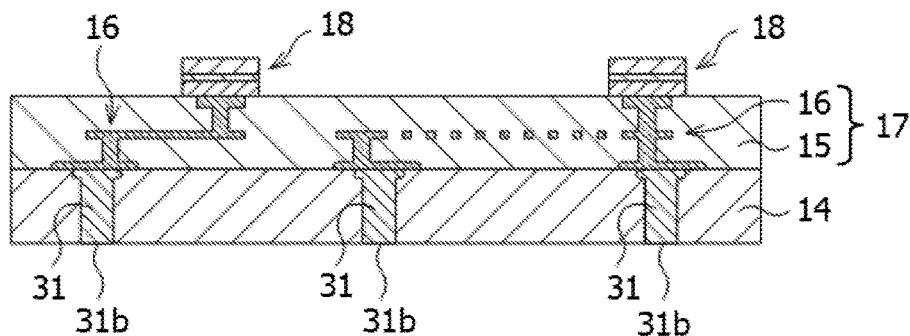
Figure 8C:
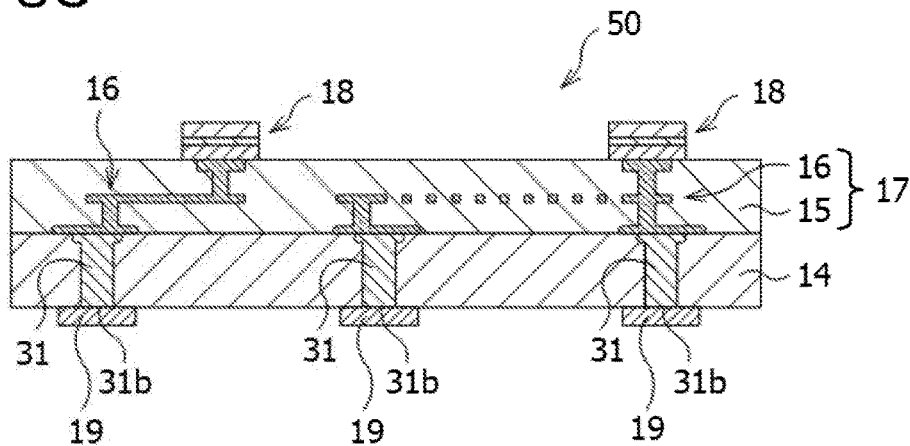
Figure 9A:
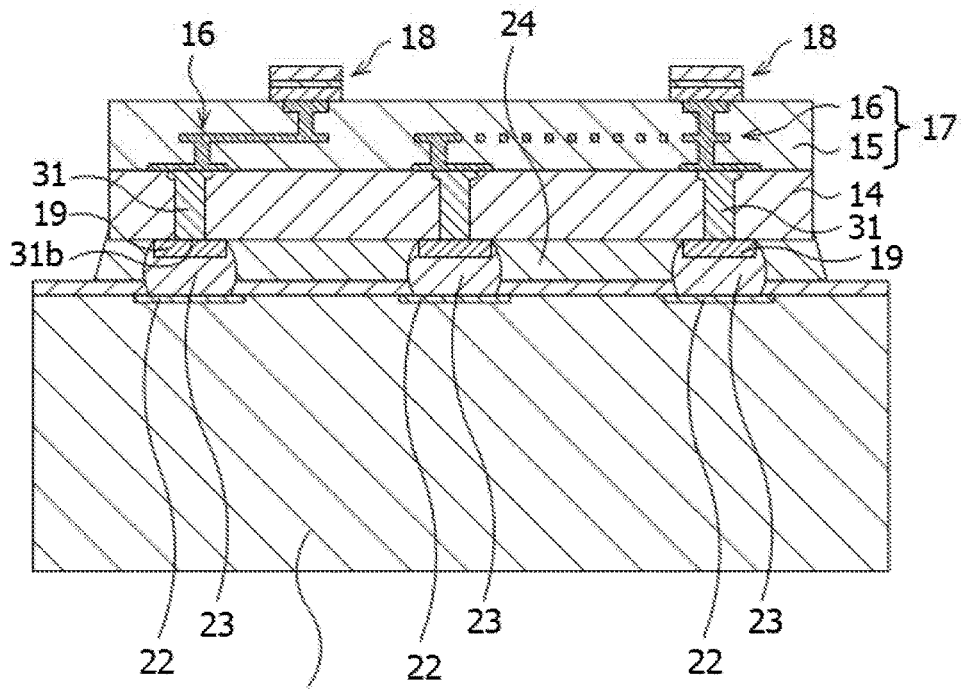
FIGS. 9A and 9B are schematic cross-sectional view illustrating, in the order of processes, continuously from FIGS. 8A to 8C, a method of manufacturing a semiconductor device having a Fan-out WLP structure by using the circuit board according to the second exemplary embodiment.
Figure 9B:
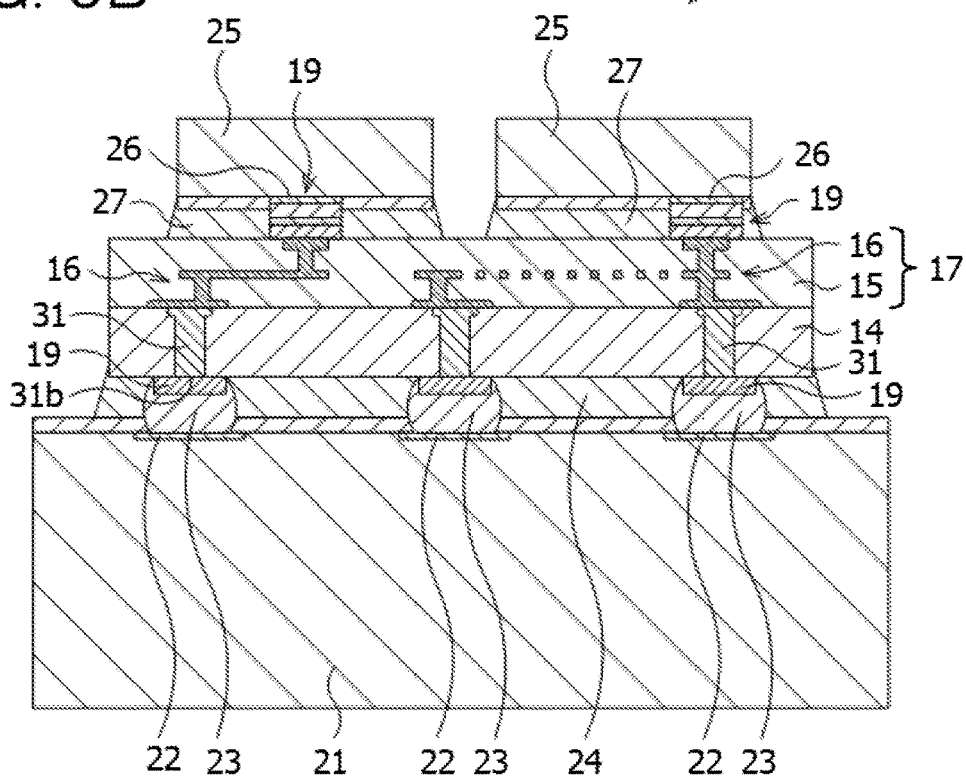

FIG. 6 is a schematic cross-sectional view illustrating a through electrode included in a resin board according to a second exemplary embodiment. FIGS. 7A to 7C are schematic cross-sectional views illustrating, in the order of processes, a method of manufacturing the resin board according to the second exemplary embodiment. FIGS. 8A to 8C are schematic cross-sectional views illustrating, in the order of processes continuously from FIGS. 7A to 7C, a method of manufacturing a circuit board by using the resin board according to the second exemplary embodiment. FIGS. 9A and 9B are schematic cross-sectional views illustrating, in the order of processes continuously from FIGS. 8A to 8C, a method of manufacturing a semiconductor device having a Fan-out WLP structure by using the circuit board according to the second exemplary embodiment.

(Method of Manufacturing Resin Board)

First, a method of manufacturing the resin board including a through electrode therein will be described.

A through electrode 31 is formed as illustrated in FIG. 6.

The through electrode 31 is a columnar electrode made of a conductor. The lower portion of the through electrode 31 is a pad portion 1, the upper portion of the through electrode 31 is a column portion 2, and the pad portion 1 and the column portion 2 are integrally formed without a material interface. The column portion 2 is a uniform diameter region that is a minimum diameter portion, and the column portion 2 has a lateral surface 31d having a uniform diameter. The pad portion 1 is a region that protrudes laterally, and has a maximum diameter portion throughout the entire through electrode 31. The pad portion 1 has a smooth lateral surface 31c of the maximum diameter portion which has no corner portion. Assuming that the bottom surface of the through electrode 31 is a first electrode surface 31a, and the top surface of the through electrode 31 is a second electrode surface 31b, an angle θ between the first electrode surface 31a and the lateral surface 31c of the pad portion 1 is formed as an obtuse angle. The first electrode surface 31a has a shape gently concave toward a center of the through electrode 31, and a diameter of the first electrode surface 31a is greater than a uniform diameter of the column portion 2.

A material of the through electrode 31 may be Cu, Al, W, Au, or the like in view of electrical conductivity and workability, but the material is not particularly limited as long as the material has electrical conductivity. In the present exemplary embodiment, as a metal pin that becomes the through electrode 31, a cylindrical body made of Cu and having a diameter of about 100 μm and a length of about 250 μm is prepared. The metal pin is fixed to a jig so that an end of the metal pin protrudes to about 40 μm, the protruding portion is plastically deformed by being buckled by using an indenter with a curved surface having a radius of curvature of 500 μm, and then detached from the jig, and the metal pin is cut such that a pin length of the opposite end to the cylindrical body becomes about 200 μm.

As a result, the through electrode 31, which is made of Cu and has a pin height of 200 μm, is formed such that the maximum diameter portion is positioned at a position of about 15 μm from a pin end, an arc of the maximum diameter portion has a height of about 30 μm and a maximum diameter of about 110 μm, and the column has a diameter of about 100 μm and a height of about 170 μm. The first electrode surface 31a, which is the bottom surface of the through electrode 31, is formed in a gently concave shape having a radius of curvature of about 500 μm.

The through electrodes 31 are distributed on the jig having holes formed at predetermined positions, and the through electrodes 31 are arranged by vibration and suction from the bottom surface of the jig. In this case, because the maximum diameter portions of the through electrodes 31 are caught by the holes of the jig, end surfaces of the through electrodes 31, which are close to the maximum diameter portions, are arranged on the top surface of the jig.

Subsequently, as illustrated in FIG. 7A, through electrodes 31 are erected.

In detail, for example, an adhesion layer 13 made of, for example, a thermoplastic adhesive (Revalpha) is attached to a surface of a support board 12 made of SUS, and the opposite surface of the adhesion layer 13 is brought into contact with the first electrode surfaces 31a which are the end surfaces close to the maximum diameter portions of the through electrodes 31 so that the pin erection is performed. The attachment of the through electrodes 31 onto the adhesion layer 13 is performed under a vacuum atmosphere of about 500 Pa to 100 Pa.

The adhesion layer 13 has double-sided adhesiveness such that the adhesion layer 13 may be attached to the surface of the support board 12 and the through electrodes 31 may be attached to the opposite surface of the adhesion layer 13. At least the adhesion layer 13 is not particularly limited as long as the grounding surface side of the through electrodes 31 may be peeled after the through electrode 31 is buried by a sealing resin. An adhesive may be appropriately selected. As the adhesive, a thermoplastic adhesive, a UV peeling type adhesive, a solvent soluble adhesive, an acid and alkali soluble adhesive, a physically peelable low adhesiveness adhesive, and the like may be exemplified. However, the adhesive may be the thermoplastic adhesive, the UV peeling type adhesive, or the physically peelable low adhesiveness adhesive, from the viewpoint that the peeling is performed within a short time without causing damage to the sealing resin and the through electrodes 31.

In addition, because it is required to irradiate the adhesion layer 13 with UV light during the peeling process in a case where the UV peeling type adhesive is used, the sealing resin or the support board 12 made of a UV transmissive material may be used. The irradiation with UV light from the sealing resin is shaded by an attachment surface of the grounding portions of the through electrodes 31, and as a result, the support board 12 may be made of a UV-transmissive material. In addition, the physically peelable low adhesiveness adhesive may not be used for a typical through electrode having a flat surface because a close contact property thereof is low with respect to the typical through electrode having a flat surface due to the an adhesive property thereof such that the pin extraction is caused when the sealing resin is introduced. In the present exemplary embodiment, the through electrodes 31 may be used without causing the so-called pin extraction by the suction effect of the through electrodes 31 which will be described below.

Subsequently, as illustrated in FIG. 7B, a resin layer 14 is formed to bury the through electrode 31.

In detail, the jig is detached from the through electrodes 31, for example, liquid sealing resin is applied, and the sealing resin is pressed by a mold. As a result, the resin layer 14 is formed on the adhesion layer 13 to bury the through electrodes 31.

The resin layer 14 is made of a sealing resin that may bury the through electrodes 31 erected on the adhesion layer 13 and may form the board by being cured. The resin layer 14 has fluidity before it is cured. The sealing resin is not particularly limited as long as the sealing resin may be cured by being heated and pressed, and the sealing resin may be appropriately selected from a liquid resin, a granular resin, a tablet-type resin, and the like. In addition, the sealing resin may contain therein a filler in order to inhibit the sealing resin from being warped due to a thermal contraction and a CTE reduction caused by a thermal process after the board is formed. As the filler alumina, silica, aluminum hydroxide, aluminum nitride, and the like may be exemplified.

Subsequently, as illustrated in FIG. 7C, the resin layer 14 is peeled from the adhesion layer 13.

In detail, the resin layer 14 is peeled from the adhesion layer 13 by heating the support board 12, on which the resin layer 14 is formed, at a temperature of about 80° C. to 170° C. The resin layer 14 is fired for about one hour in an oven at a temperature of 180° C. to 250° C., and as a result, the resin layer 14 is completely cured. As described above, a resin board 40, which has a thickness of about 600 μm and in which the through electrodes 31 are buried by the resin layer 14, is formed. The first electrode surfaces 31a of the through electrodes 31 are exposed from a surface (bottom surface in FIG. 7C) of the resin board 40. Since the resin board 40 is formed as described above, the pin extraction does not occur due to the flow resistance of the liquid sealing resin.

(Method of Manufacturing Circuit Board)

Next, a method of manufacturing a circuit board having the resin board 40 will be described.

Subsequently from FIG. 7C, a multilayered wiring structure 17 and first bumps 18 are formed as illustrated in FIG. 8A.

In detail, first, Ti having a thickness of about 0.1 μm as a close contact layer for forming fine wiring and Cu having a thickness of about 0.5 μm as a seed layer are sequentially formed, by a sputtering method, on the surface of the resin layer 14 from which the first electrode surfaces 31a of the through electrodes 31 are exposed.

Next, for example, a novolac-type liquid resist is applied by a spin coating method. The resist is exposed and developed by a contact aligner using a glass mask having land patterns of about φ100 μm. Therefore, a resist mask having openings of the land patterns of about φ100 μm is formed on the first electrode surface 31a of the through electrode 31 in the resin layer 14.

Next, plating is performed in the openings of the land patterns of the resist mask by electrolytic Cu plating. In this case, the electrolytic Cu plating is performed to a thickness of about 5 μm. The resist mask is peeled using, for example, N-methyl-2-pyrrolidinone. Next, the seed layer Cu of a portion, which is not plated by being covered by the resist mask is etched using an ammonium persulfate solution, and Ti of the portion is sequentially etched using an ammonium fluoride solution. Therefore, the lands of about φ100 μm are formed on the first electrode surfaces 31a.

Next, for example, a photosensitive polyimide resin material is applied by spin coating, and temporarily cured for about two minutes by a hot plate at about 150° C. Thereafter, the photosensitive polyimide resin material is exposed and developed by a contact aligner using a glass mask having via patterns of φ70 μm which are disposed to be superimposed on the lands of about φ100 μm. Therefore, via grooves of about φ70 μm, which communicate with the lands, are formed in the photosensitive polyimide resin material. Thereafter, the photosensitive polyimide resin material is mainly cured for about one hour at about 180° C. to 250° C. using an oven under a nitrogen atmosphere. Therefore, a first insulating layer having a thickness of about 10 μm is formed.

Next, Ti having a thickness of about 0.1 μm as a close contact layer and Cu having a thickness of about 0.5 μm as a seed layer are sequentially formed by a sputtering method.

Next, for example, a novolac-type liquid resist is applied by a spin coating method. The resist is exposed and developed by a contact aligner using a glass mask having land patterns of about φ100 μm, which are disposed to be superimposed on the via grooves of about φ70 μm, and having a wiring pattern having a width of about 5 μm. Therefore, a resist mask, which has openings of the land patterns of about φ100 μm and the wiring pattern of about 5 μm at predetermined positions, is formed.

Next, plating is performed in the openings of the land patterns and the wiring pattern of the resist mask by electrolytic Cu plating. In this case, the electrolytic Cu plating is performed to a height of about 5 μm. The resist mask is peeled using N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. As a result, the lands and the wiring are formed.

Next, for example, a photosensitive polyimide resin material is applied by spin coating, and temporarily cured for about two minutes by a hot plate at about 150° C. Thereafter, the photosensitive polyimide resin material is exposed and developed by a contact aligner using a glass mask having via patterns of about φ70 μm which are disposed to be superimposed on the lands of about φ100 μm. Therefore, via grooves of about φ70 μm, which communicate with the lands, are formed in the photosensitive polyimide resin material. Thereafter, the photosensitive polyimide resin material is mainly cured for about one hour at about 180° C. to 250° C. using an oven under a nitrogen atmosphere. Therefore, a second insulating layer having a thickness of about 10 μm is formed.

Next, Ti having a thickness of about 0.1 μm as a close contact layer and Cu having a thickness of about 0.5 μm as a seed layer are sequentially formed by a sputtering method.

Next, for example, a novolac-type liquid resist is applied by a spin coating method. The resist is exposed and developed by a contact aligner using a glass mask having land patterns of about φ100 μm, which are disposed to be superimposed on the via grooves of about φ70 μm, and having a wiring pattern having a width of about 5 μm. Therefore, a resist mask, which has openings of the land patterns of about φ100 μm and the wiring pattern of about 5 μm at predetermined positions, is formed.

Next, plating is performed in the openings of the land patterns and the wiring pattern of the resist mask by electrolytic Cu plating. In this case, the electrolytic Cu plating is performed to a thickness of about 5 μm. The resist mask is peeled using N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. As a result, the lands and the wiring are formed.

Next, for example, a photosensitive polyimide resin material is applied by spin coating, and temporarily cured for about two minutes by a hot plate at about 150° C. Thereafter, the photosensitive polyimide resin material is exposed and developed by a contact aligner using a glass mask having via patterns of about φ70 μm which are disposed to be superimposed on the lands of about φ100 μm. Therefore, via grooves of about φ70 μm, which communicate with the lands, are formed in the photosensitive polyimide resin material. Thereafter, the photosensitive polyimide resin material is mainly cured for about one hour at about 180° C. to 250° C. using an oven under a nitrogen atmosphere. Therefore, a third insulating layer having a thickness of about 10 μm is formed.

Therefore, the multilayered wiring structure 17, in which a wiring layer 16 having the lands and the wiring is buried in an insulating layer 15 including a first insulating layer, a second insulating layer, and a third insulating layer, is formed.

Meanwhile, the above-mentioned process of manufacturing the multilayered wiring structure 17 is one aspect of the present exemplary embodiment, and any other forming methods may be appropriately selected as necessary. In addition, in a case where the wiring is formed by laminating three or more layers, the wiring may be formed by repeating the above-mentioned process.

Next, Ti having a thickness of about 0.1 μm as a close contact layer and Cu having a thickness of about 0.5 μm as a seed layer are sequentially formed by a sputtering method.

Next, for example, a novolac-type liquid resist is applied by a spin coating method. The resist is exposed and developed by a contact aligner using a glass mask having first bump patterns of about φ100 μm which are disposed to be superimposed on the via grooves of about φ70 μm formed in the uppermost layer of a fine wiring portion. Therefore, a resist mask, which has openings of the first bump patterns of about φ100 μm at predetermined positions, is formed.

Next, plating is performed in the openings of the first bump pattern of the resist mask by electrolytic Cu plating, electrolytic Ni plating, and electrolytic SnAg plating. In this case, the electrolytic Cu plating is performed to a height of about 30 μm, the electrolytic Ni plating is performed to a height of about 10 μm, and the electrolytic SnAg plating is performed to a height of about 30 μm. The resist mask is peeled using N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. Therefore, a Cu layer 18a, an Ni layer 18b, and an SnAg layer 18c are sequentially laminated such that the first bumps 18 electrically connected to the wiring layer 16 is formed.

Subsequently, as illustrated in FIG. 8B, the second electrode surface 31b of the through electrode 31 is exposed from the back surface of the resin layer 14.

In detail, for example, a BG tape is attached to the front surface of the multilayered wiring structure 17, and the back surface of the resin layer 14 of the resin board 40 is ground by, for example, back grinding, such that the second electrode surfaces 31b are exposed.

Subsequently, as illustrated in FIG. 8C, second bumps 19 are formed.

In detail, Ti having a thickness of about 0.1 μm as a close contact layer and Cu having a thickness of about 0.5 μm as a seed layer are sequentially formed by a sputtering method on the back surface of the resin layer 14 from which the second electrode surfaces 31b are exposed.

Next, for example, a novolac-type liquid resist is applied by a spin coating method. The resist is exposed and developed by a contact aligner using a glass mask having second bump patterns of about φ500 μm which are disposed to be superimposed on the through electrodes 31. Therefore, a resist mask, which has openings of the second bump patterns of about φ500 μm at predetermined positions, is formed.

Next, plating is performed in the openings of the second bump patterns by electrolytic Cu plating. In this case, the electrolytic Cu plating is performed to a height of about 100 μm from the second electrode surface 31b. The resist mask is peeled using N-methyl-2-pyrrolidinone. Next, the seed layer Cu of a portion, which is not plated by being covered by the resist mask, is etched using an ammonium persulfate solution, and Ti of the portion is sequentially etched using an ammonium fluoride solution. Therefore, the second bumps 19 electrically connected to the through electrodes 31 are formed. Therefore, a circuit board 50 having the resin board 40 is formed.

(Method of Manufacturing Semiconductor Device)

Next, a method of manufacturing a semiconductor device having the circuit board 50 will be described.

Subsequently from FIG. 8C, as illustrated in FIG. 9A, the circuit board 50 is mounted on a printed circuit board 21.

In detail, first, solder balls 23 having a diameter of about 700 μm are disposed on bumps 22 on the printed circuit board 21. A flux is applied such that the second bump 19 is mounted to come into contact with the solder balls 23. Thereafter, reflow is performed at a temperature of about 260° C., and flux cleaning is performed.

Next, a gap between the front surface of the printed circuit board 21 and the back surface of the circuit board 50 is buried by an under fill 24. The under fill is injected by heating at about 110° C., and a curing process is performed for about one hour at about 120° C. to 170° C. after the injection. After curing the under fill 24, no defect such as deformation is found in the multilayered wiring structure 17.

The forming process illustrated in FIG. 9A is one aspect of joining the circuit board 50 to the printed circuit board 21, and any other forming process may be appropriately selected as necessary. In addition, the circuit board 50 may be mounted on a semiconductor chip using a predetermined semiconductor chip instead of the printed circuit board 21.

Subsequently, as illustrated in FIG. 9B, semiconductor chips 25 are mounted on the circuit board 50.

In detail, first, the semiconductor chips 25 are disposed on the circuit board 50 such that the first bumps 18 and the bumps 26 of the semiconductor chips 25 come into contact with each other. Thereafter, reflow is performed at a temperature of about 260° C., and flux cleaning is performed.

Next, a gap between the front surface of the circuit board 50 and the back surfaces of the semiconductor chips 25 are buried by an under fill 27. The under fill is injected by heating at about 110° C., and a curing process is performed for about one hour at about 120° C. to 170° C. after the injection.

Therefore, a semiconductor device 60 in which the semiconductor chips 25 are mounted on the circuit board 50 is formed. As a result of evaluating the reliability of the formed semiconductor device 60, it has been found that neither electrical connection defect nor electric leakage is observed, and the semiconductor device is good.

The forming process illustrated in FIG. 9B is one aspect of joining the semiconductor chips 25 to the circuit board 50, and any other forming process may be appropriately selected as necessary. In addition, the printed circuit board may be mounted on the circuit board 50 by using the predetermined printed circuit board instead of the semiconductor chips 25.

In general, the through electrodes are often formed to have a columnar structure having a uniform diameter. In this case, electric fields between the through electrodes are concentrated at the end edge portions of the through electrodes by an edge effect. That is, in a case where the multilayered wiring structure is formed on the resin layer of the resin board, electric field concentration occurs between the through electrodes at a material interface between the resin layer of the resin board and the insulating layer of the multilayered wiring structure, and as a result, a short-circuit occurs at the material interface having low voltage resistance. In addition, in the case of a through electrode having a tapered shape in which the through electrode diameter is increased toward any one of front and back surfaces of the resin board, the electric field concentration becomes prominent at a side having a larger electrode diameter, and as a result, reliability of the circuit board significantly deteriorates.

Figure 10:
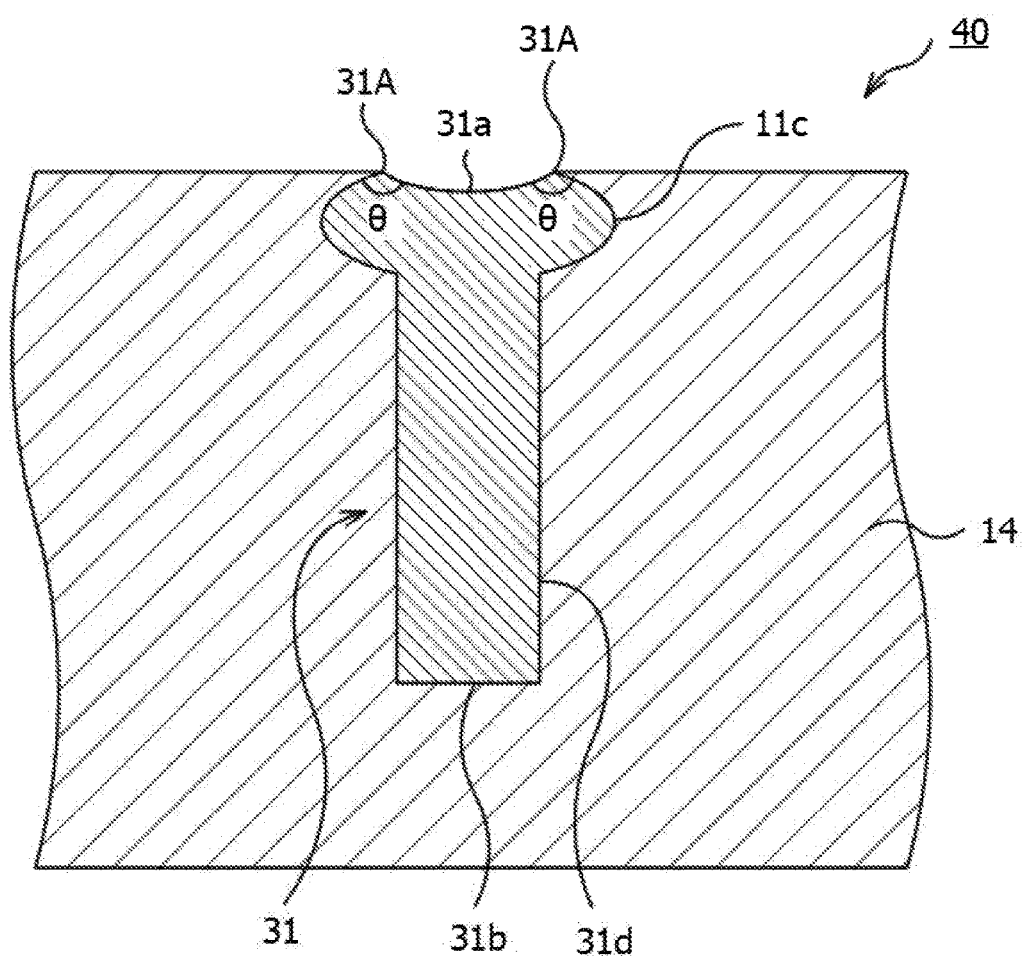
FIG. 10 is a schematic cross-sectional view for explaining an operational effect of the through electrode of the resin board according to the second exemplary embodiment.

As illustrated in FIG. 10, in a resin board 40 according to the present exemplary embodiment, an angle θ between the first electrode surface 31a exposed from the surface of the resin layer 14 and the lateral surface 31c of the pad portion 1 in the through electrode 31 is formed as an obtuse angle. With the configuration, the electric field concentration at an edge portion 31A is mitigated, and an insulation breakdown is inhibited so that a short-circuit is prevented.

In the through electrode 31, the pad portion 1, which has the smooth lateral surface 31c with no corner portion at the maximum diameter portion, is formed, and the maximum diameter portion is positioned at a more inner side than the front and back surfaces of the resin layer 14. With the configuration, an electric field applied between the through electrodes 31 is shifted to the inside of the resin board 40 such that the electric field concentration at the edge portion 31A is further mitigated.

In the through electrode 31, the pad portion 1 is eccentrically located at any one of the front surface side and the back surface side of the resin layer 14 (in FIG. 10, the front surface side). With the configuration, a shift effect due to the electric field concentration varies depending on a distance from the electrode surface of the through electrode 31 to the maximum diameter portion, and as a result, the side of the maximum diameter portion, which is closer to the electrode surface (here, the first electrode surface 31a), is able to effectively trap the electric field concentration.

In the through electrode 31, a portion other than the pad portion 1 is formed as the column portion 2 having the uniform diameter region which is the minimum diameter portion. With the configuration, unnecessary electric field concentration may be inhibited at a portion other than the maximum diameter portion.

In the through electrode 31, the first electrode surface 31a has a shape gently concave toward the center of the through electrode 31, and the diameter of the first electrode surface 31a is greater than the uniform diameter of the column portion 2. With the configuration, in the process illustrated in FIG. 7A, the following various effects are achieved when forming the resin board 40 in accordance with the present exemplary embodiment.

With the configuration, the through electrodes 31 maintain a close contact property without being peeled from the adhesion layer 13 by the flow resistance of the sealing resin when the through electrodes 31 erected on the adhesion layer 13 are buried by the sealing resin, and as a result, the through electrodes 31 may be formed at a high yield.

Figure 11A:
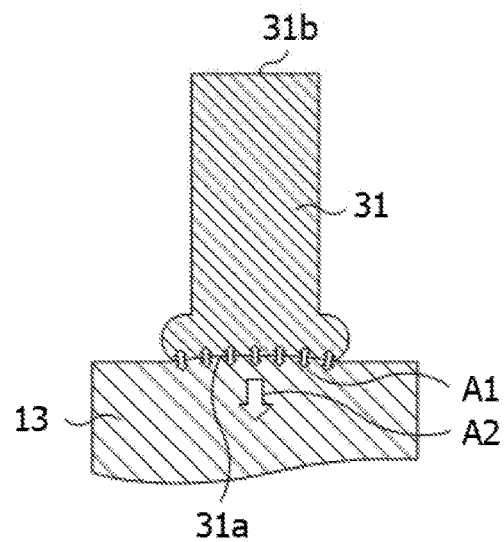
FIGS. 11A to 11C are schematic cross-sectional views for explaining an operational effect of a method of forming the through electrode of the resin board according to the second exemplary embodiment.

A first effect is illustrated in FIG. 11A. With the first electrode surface 31a concavely and gently curved, the adhesion layer 13, which is in contact with the first electrode surface 31, is pulled in an axial direction of the through electrode 31 as indicated by arrows A1. The adhesion force of the through electrode 31 with the adhesion layer 13 is enhanced by the elastic force of the adhesion layer 13 as indicated by arrow A2.

Figure 11B:
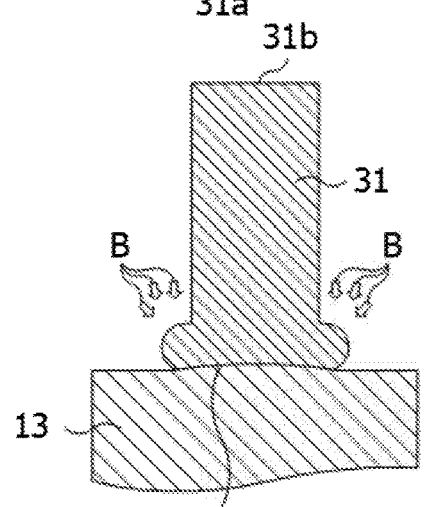

A second effect is illustrated in FIG. 11B. By a suction effect (indicated by arrow B) of the first electrode surface 31a concavely and gently curved, the adhesion force of the through electrode 31 with the adhesion layer 13 is enhanced. To further intensify the suction effect, the through electrode 31 may be attached to the adhesion layer 13 under a vacuum atmosphere, for example, equal to or lower than 1,000 Pa. In the case of the attachment under a pressure atmosphere above 1,000 Pa, a difference in pressure between the interfaces between the adhesion layer 13 and the through electrode 31 and an outer circumference of the through electrode 31 is small, and as a result, in some cases, a sufficient suction effect may not be obtained.

Figure 11C:
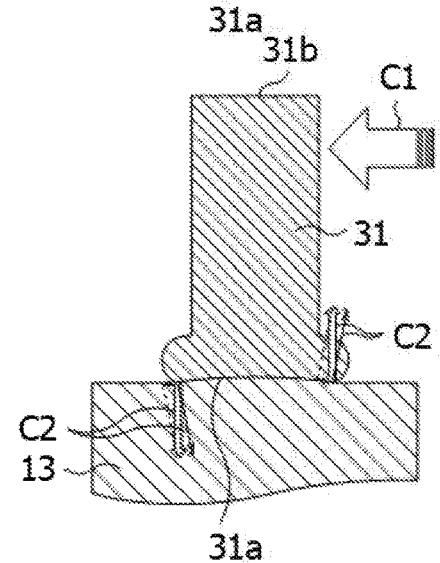

A third effect is illustrated in FIG. 11C. Due to the flow resistance of the sealing resin when being buried by the sealing resin, the through electrode 31 receives a rotational moment indicated by arrow C1 at the grounding surface of the adhesion layer 13. Since the first electrode surface 31a is a gently curved concave surface, the force received by the interfaces between the adhesion layer 13 and the first electrode surface 31a by the rotational moment is dispersed in a normal direction and a tangential direction (indicated by arrows C2) in accordance with the curved concave shape of the first electrode surface 31a. Therefore, the adhesion force of the through electrode 31 with the adhesion layer 13 is enhanced.

As described above, according to the present exemplary embodiment, the electric field concentration at the through electrode 31 is mitigated so that a highly reliable resin board 40 which inhibits the occurrence of a short-circuit is implemented.

In addition, by using the resin board 40, the electric field concentration at the through electrode 31 is mitigated, and as a result, the occurrence of a short-circuit at an interface between the resin board 40 and the multilayered wiring structure 17 is inhibited by using the resin board 40, so that a highly reliable circuit board 50 may be obtained at a high yield and with low costs.

By using the circuit board 50, a sufficient mechanical strength of the multilayered wiring structure 17 may be obtained and as a result, a semiconductor device 60 having excellent resistance against stress caused by CTE mismatch among the printed circuit board 21, the under fills 24 and 27, and the semiconductor chip 25 may be implemented.

According to the present exemplary embodiment, the through electrode 31 may securely stand on the support board 12 through the adhesion layer 13 with a strong adhesion force when forming the resin board 40, and as a result, the resin board 40 including the through electrodes 31 may be excellently manufactured without causing the so-called pin withdrawal.

The through electrodes 11 and 31 in the first and second exemplary embodiments may be applied to, for example, layer printed circuit boards, MEMS, chip package boards, silicon interposers, and the like, in addition to the resin board of the semiconductor device having the Fan-out WLP structure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A resin board comprising:
   a first resin layer;
   a columnar electrode buried in the first resin layer, the columnar electrode including a protruding portion that protrudes from a side surface of the columnar electrode and configured to cause an electric field applied to the columnar electrode to shift to inside of the first resin layer, the protruding portion having an exposed surface exposed from the first resin layer and a non-linear lateral surface connecting the exposed surface and the side surface, such that the exposed surface and the lateral surface form an obtuse angle; and
   a second resin layer formed on the first resin layer so as to be in close contact with no gaps and including a plurality of wiring layers electrically connected to the columnar electrode through the exposed surface,
   wherein a portion corresponding to a maximum diameter at the lateral surface of the protruding portion is embedded in the first resin layer,
   a diameter of the exposed surface is smaller than the maximum diameter, and
   the exposed surface has a shape which is recessed in a direction different from a direction of the second resin layer at a surface of the first resin layer.

2. The resin board according to claim 1, wherein
   the protruding portion includes a smooth lateral surface with no corner portion at the portion corresponding to the maximum diameter of the protruding portion, and
   the protruding portion is eccentrically located at any one of a from surface side and a back surface side of the first resin layer.

3. The resin board according to claim 1, wherein the columnar electrode has a uniform diameter region in the lateral surface thereof.

4. The resin board according to claim 3, wherein the columnar electrode has a minimum diameter portion in the uniform diameter region.

5. The resin board according to claim 3, wherein, a diameter of the exposed surface is greater than a diameter of the uniform diameter region.

6. The resin board according to claim 3, wherein
   the uniform diameter region includes an exposed surface exposed from an another surface of the first resin layer, the another surface being opposite side of the exposed surface of the protruding portion, and
   the resin board further comprises
      a second bump protruded from the first resin layer and configured to be formed so that the exposed surface of the uniform diameter region and a part of the another surface are covered, the bump being used for attaching a solder ball.

7. The resin board according to claim 6, wherein the second bump includes:
   a titanium layer formed on the exposed surface of the uniform diameter region,
   a copper sputtering layer formed on the titanium layer, and
   a copper plating layer formed on the copper sputtering layer.

8. The resin board according to claim 1, wherein
   an angle between a direction from a contour of the exposed surface to a center of the exposed surface and a side surface of the protruding portion forms an obtuse angle.

9. The resin board according to claim 1, wherein
   a material of the columnar electrode is copper (Cu), aluminum (Al) or tungsten (W).

10. The resin board according to claim 1, wherein the resin board further comprises
   a first bump protruded from the second resin layer and electrically connected with the plurality of wiring layers.

11. The resin board according to claim 1, wherein the bump includes:
a copper plating layer formed on the second resin layer,
a nickel plating layer formed on the copper plating layer, and
a tin-silver (SnAg) alloy plating layer formed on the nickel plating layer.

* * * * *